United States Patent
Uemura

(10) Patent No.: US 6,835,958 B2
(45) Date of Patent: Dec. 28, 2004

(54) LIGHT-EMITTING DEVICE

(75) Inventor: Toshiya Uemura, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/358,390

(22) Filed: Feb. 5, 2003

(65) Prior Publication Data

US 2003/0160259 A1 Aug. 28, 2003

(30) Foreign Application Priority Data

Feb. 6, 2002 (JP) .......... 2002-030151

(51) Int. Cl.$^7$ .......... H01L 27/15
(52) U.S. Cl. .......... 257/79; 257/81; 257/91; 257/95; 257/98; 257/99
(58) Field of Search .......... 257/79–103

(56) References Cited

U.S. PATENT DOCUMENTS

| | | | |
|---|---|---|---|
| 6,245,259 B1 * | 6/2001 | Hohn et al. | 252/301.36 |
| 6,287,947 B1 | 9/2001 | Ludowise et al. | |
| 6,310,364 B1 | 10/2001 | Uemura | |
| 6,518,598 B1 * | 2/2003 | Chen | 257/91 |
| 2002/0040982 A1 | 4/2002 | Uemura | |

FOREIGN PATENT DOCUMENTS

| | | |
|---|---|---|
| JP | 5-335622 | 12/1993 |
| JP | 6-232450 | 8/1994 |
| JP | 6-237012 | 8/1994 |
| JP | 6-338632 | 12/1994 |
| JP | 9-107125 | 4/1997 |
| JP | 10-117017 | 5/1998 |
| JP | 10-151794 | 6/1998 |
| JP | 10-256602 | 9/1998 |
| JP | 11-68166 | 3/1999 |
| JP | 11-68167 | 3/1999 |
| JP | 2000-36626 | 2/2000 |
| JP | 2000-164933 | 6/2000 |
| JP | 2000-164939 | 6/2000 |
| JP | 2001-7405 | 1/2001 |
| JP | 2001-24238 | 1/2001 |
| JP | 2001-77430 | 3/2001 |
| JP | 2001-223388 | 8/2001 |

* cited by examiner

Primary Examiner—Long Pham
Assistant Examiner—Wai-Sing Louie
(74) Attorney, Agent, or Firm—McGinn & Gibb, PLLC

(57) ABSTRACT

A light emitting device includes a light-emitting element comprising a light emitting layer for emitting a light of a predetermined wavelength and p- and n-type electrodes for applying a predetermined voltage across the light emitting layer, a lead structure including p- and n-leads for mounting the light-emitting element thereon, and a light-transmitting paste containing a phosphor for fixing the light-emitting element to the lead structure. The p-type electrode is provided on a light-radiating side of the light emitting layer, and includes a light emitting area for transmitting a light therethrough and a wire-bonding area to an outside surface of which a bonding wire is bonded and for reflecting a light on an inside surface thereof. This results in providing a light emitting device which is increased in luminous efficiency, and/or decreased in fabrication cost without inviting a complicated construction.

17 Claims, 3 Drawing Sheets

LIGHT-EMITTING DEVICE

The present application is based on Japanese Patent Application No.2002-030151, the entire contents of which are incorporated herein by reference.

BACKGROUND OF THE INVENTION

1. Field of the Invention

The present invention relates to a light emitting device, and more particularly to a light emitting device which emits a whitish light with a simplified construction.

2. Prior Art

Japanese patent Laid-Open No. 068166/1999 discloses a light emitting device to emit a light obtained by converting a wavelength of a light emitted from a light-emitting element.

In this light emitting device, a half-mirror (translucence) reflection film is formed on a whole surface of a p-type layer, while a substrate is fixed on a cup portion of a lead frame by a light-transmitting paste including a phosphor.

According to the light emitting device as constructed above, a reflected light of a light going from a light emitting layer to an upper side (a side of p-type layer) by the reflection film and a light going from a light emitting layer to an lower side (a side of n-type layer) are reached the fluorescent paste, in which the wavelength of the light is converted, and then a wavelength-converted light goes to the upper side.

Then, a part of the wavelength-converted light passes through the half-mirror (translucence) reflection film after combining with an inherent light of the light emitting layer, that is, a light, a wavelength of which is not converted, and then it is released outside.

In the conventional light emitting device described above, a color tone of the emitted light can be adjusted freely by changing a reflectance of the half-mirror reflection film. However, a decline of a luminous efficiency can not be avoided, because a part of the light is absorbed by the reflection film.

On the other hand, the reduction of fabrication cost has been required in fabricating of the light emitting device.

SUMMARY OF THE INVENTION

Accordingly, it is an object of the invention to provide a light emitting device which is increased in luminous efficiency. It is a further object of the invention to provide a light emitting device which is decreased in fabrication cost without inviting a complicated construction.

According to the first feature of the invention, a light-emitting element includes a light emitting layer for emitting a light of a predetermined wavelength, and p- and n-type electrodes for applying a predetermined voltage across the light emitting layer. The p-type electrode is provided on a light-radiating side of the light emitting layer, and includes a light emitting area for transmitting a light therethrough, and a wire-bonding area to an outside surface of which a bonding wire is bonded and for reflecting a light on an inside surface thereof.

In accordance with a preferred embodiment of the invention, the light emitting area is provided with a predetermined number of opening portions arranged in a predetermined pattern. Each of the predetermined number of opening portions is shaped to be one selected from rectangle, circle, and slit-shape. The light emitting area and the wire-bonding area are equal in thickness to each other.

According to the second feature of the invention, a light emitting device includes a light-emitting element comprising a light emitting layer for emitting a light of a predetermined wavelength and p- and n-type electrodes for applying a predetermined voltage across the light emitting layer, a lead structure including p- and n-leads for mounting the light-emitting element thereon, and a light-transmitting paste containing a phosphor for fixing the light-emitting element to the lead structure. The p-type electrode is provided on a light-radiating side of the light emitting layer, and includes a light emitting area for transmitting a light therethrough and a wire-bonding area to an outside surface of which a bonding wire is bonded and for reflecting a light on an inside surface thereof.

In accordance with a preferred embodiment of the invention, the wire-bonding area reflects a substantially whole portion of the light on the inside surface thereof. The light emitting area is provided with a predetermined number of opening portions arranged in a predetermined pattern. Each of the predetermined number of opening portions is shaped to be one selected from rectangle, circle, and slit-shape. The light emitting area and the wire-bonding area are equal in thickness to each other. The light emitting area and the wire-bonding area are uniform in thickness to be 0.3 $\mu$m or more. The light emitting area transmits a whitish light from inside to outside therethrough in accordance with the light of the predetermined wavelength and a light of a converted wavelength emitted from the phosphor which is excited by the light of the predetermined wavelength. The p- and n-leads of the lead structure are p- and n-lead frames, one of the p- and n-lead frames having a cup-shaped portion in which the light-emitting element is mounted via the light-transmitting paste, and the p- and n-type electrodes are connected to the p- and n-lead frames by bonding wires, respectively. The light-emitting element, the bonding wires, and portions of the p- and n-lead frames are sealed by a sealing resin. The sealing resin is shaped to be a lens for focusing a light transmitted through the light emitting area. The p- and n-leads of the lead structure are p- and n-electrode patterns provided on a substrate, one of the p- and n-electrode patterns having an element-mounting portion on which the light-emitting element is mounted via the light-transmitting paste, and the p- and n-type electrodes are connected to the p- and n-electrode patterns by bonding wires, respectively. A reflector having an inner mirror surface of a reverse conical shape for reflecting the light of the predetermined wavelength and a light of a converted wavelength emitted from the phosphor which is excited by the light of the predetermined wavelength. The light-emitting element, the bonding wires, and portions of the p- and n-electrode patterns are sealed in the reflector by a sealing resin.

According to the light emitting device having the above construction, among the light emitted from the light-emitting element, a light going to a side of n-type layer and a reflected light of a light going to a side of p-type layer by the p-type electrode are entered to the light-transmitting paste containing the phosphor (defined as "fluorescent paste" hereinafter), in which the wavelength of the light is converted.

The light (defined as "fluorescent light" hereinafter) that its wavelength has been converted is reflected by a cup-shaped portion of the lead frame which is a mounting seat for the light-emitting element, and goes to the p-type electrode, and then a part of that is released from the opening portions of the p-type electrode outside together with the light emitted directly from the light-emitting element. A rest of the fluorescent light is reflected by the p-type electrode, and reflected again by the lead frame (these reflections are repeated), and finally released to the outside from the opening portions of the p-type electrode.

In the light emitting device of the invention, the light emitted from the light-emitting element is not absorbed by the non-opening region of the p-type electrode, because the total light is substantially reflected by the p-type electrode. Therefore, the outside-release-efficiency of the light is improved.

In accordance with a preferred embodiment of the invention, the p-type electrode is a film of a substantially uniform thickness, and has a light emitting area and a bonding area. The light emitting area has optical opening portions for releasing the light to the outside. A conductive wire is bonded to the bonding area. The bonding area is required to be a predetermined film thickness to realize stable wire bonding operation. According to the inventers of the invention, the film thickness of the bonding area is preferably more than 0.3 $\mu$m.

In order to simplify a forming step of the p-type electrode, it is preferable to form the light emitting area and the bonding area at the same time. In such a case, the light emitting area and the bonding area are approximately equal in thickness.

As shown in a light emitting device in Japanese patent Laid-Open No. 068166/1999, a p-type electrode of a light-emitting element has a bonding electrode which is additionally provided other than a reflection film. In the present invention, however, the bonding electrode can be omitted to reduce the fabrication cost of the p-type electrode, thereby resulting in a light-emitting element of a low cost which leads to a light emitting device of a low cost.

On the other hand, Japanese patent Laid-Open No. 232450/1994 and Japanese patent Laid-Open No. 237012/1994 disclose p-type electrodes having opening portions. However, each of these p-type electrodes comprises no bonding area.

BRIEF DESCRIPTION OF THE DRAWINGS

The present invention will be explained in more detail in conjunction with the appended drawings, wherein.

DETAILED DESCRIPTION OF THE PREFERRED EMBODIMENTS

Figure 1:
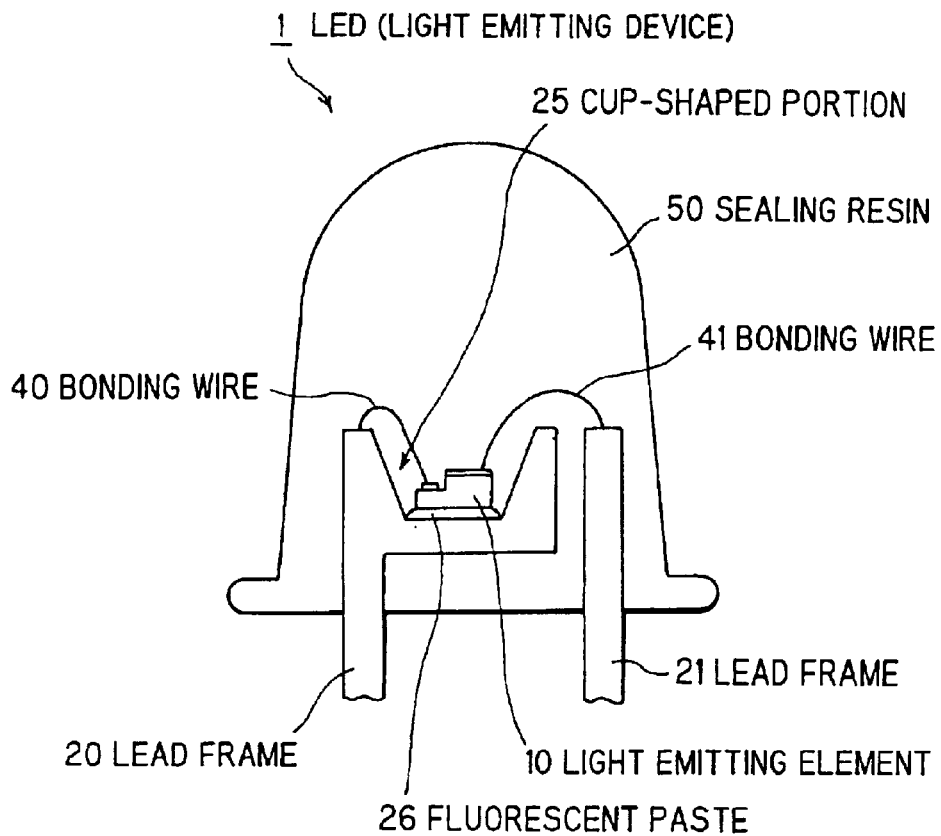
FIG. 1 is a schematic cross-sectional view showing the construction of a shell-shaped LED which is a light emitting device in an embodiment of the invention.

Each part of a light-emitting element of the invention will be explained in detail.
(Light-Emitting Element)

A light emitting diode is adopted as a light-emitting element. The use of a light-emitting element for a short wavelength of a group III nitride compound semiconductor is preferred.

The light-emitting element of a group III nitride compound semiconductor includes a substrate and group III nitride compound semiconductor layers stacked on the substrate. A p-type electrode and an n-type electrode are further provided.

The substrate may be formed of any material so far as a group III nitride compound semiconductor layer can be grown thereon. Materials for the substrate usable herein may include, for example, sapphire, spinel, silicon, silicon carbide, zinc oxide, gallium phosphide, gallium arsenide, magnesium oxide, and manganese oxide. The use of a sapphire substrate is particularly preferred. When the sapphire substrate is used, the a-face is preferably utilized from the viewpoint of growing a group III nitride compound semiconductor layer having good crystallinity.

Group III nitride compound semiconductor layers are stacked on the substrate. Here, the group III nitride compound semiconductor is represented by general formula $Al_xGa_yIn_{1-x-y}N$, wherein $0 \leq X \leq 1$, $0 \leq Y \leq 1$, and $0 \leq X+Y \leq 1$, and includes the so-called binary compound semiconductors, such as AlN, GaN, and InN, and the so-called ternary compound semiconductors represented by formulae $Al_xGa_{1-x}N$ wherein $0<x<1$, $Al_xIn_{1-x}N$ wherein $0<x<1$, and $Ga_xIn_{1-x}N$ wherein $0<x<1$. Boron (B), thallium (Tl), etc. may be substituted for at least a part of the group III element(s). Further, phosphorus (P), arsenic (As), antimony (Sb), bismuth (Bi), etc. may be substituted for at least a part of nitrogen (N). The group III nitride compound semiconductor layer may contain any dopant. N-type impurities usable herein include silicon (Si), germanium (Ge), selenium (Se), tellurium (Te), and carbon (C). P-type impurities usable herein include magnesium (Mg), zinc (Zn), beryllium (Be), calcium (Ca), strontium (Sr), and barium (Ba). After doping with a p-type impurity, the group III nitride compound semiconductor may be exposed to electron beams, plasma, or heat in an oven. This treatment, however, is not indispensable. The group III nitride compound semiconductor layer may be formed by any method without particular limitation, for example, by well-known methods such as metal organic chemical vapor deposition (MOCVD), molecular beam epitaxy (MBE), halide vapor phase epitaxy (HVPE), sputtering, ion plating, and electron shower.

The light-emitting element may have a homo structure, a single hetero structure, or a double hetero structure. A quantum well structure (a single quantum well structure or a multiple quantum well structure) may also be adopted.

A buffer layer may be provided between the substrate and the crystal layer of a group III nitride compound semiconductor. The purpose of providing the buffer layer is to improve the crystallinity of the group III nitride compound semiconductor grown on the buffer layer. The buffer layer maybe formed of a group III nitride compound semiconductor such as AlN, InN, GaN, AlGaN, InGaN, or AlInGaN.

Materials for the n-side electrode usable herein include metals, such as aluminum (Al), vanadium (V), tin (Sn), rhodium (Rh), titanium (Ti), chromium (Cr), niobium (Nb), tantalum (Ta), molybdenum (Mo), tungsten (W), and hafnium (Hf), or alloys of any two or more of them. The n-side electrode may have a two-layer or multilayer structure in which layers of different compositions are stacked on each other. For example, a two-layer structure of vanadium and aluminum may be adopted.

The group III nitride compound semiconductor light-emitting element may be produced, for example, by the following method.

A substrate on which a group III nitride compound semiconductor layer can be grown is first provided. A plurality of semiconductor layers, that is, at least an n-type group III nitride compound semiconductor layer, a layer including a light emitting layer formed of a group III nitride compound semiconductor, and a p-type group III nitride compound semiconductor layer, are stacked in that order on the substrate.

Next, the layers thus grown are etched to expose a part of the n-type semiconductor layer. A p-side electrode and an n-side electrode are then formed on the p-type group III nitride compound semiconductor layer and on the n-type group III nitride compound semiconductor layer, respectively. The p-side electrode and the n-side electrode may be formed by a conventional method such as vapor deposition or sputtering. The substrate is then polished by abrasives having a desired particle diameter to a desired thickness, followed by chip isolation.

(P-Type Electrode)

A p-type electrode reflects a substantially total light emitted from a light emitting layer of a light-emitting element. In other words, a p-type electrode has a film thickness or a layer composition through which the light emitted from a light emitting layer transmits. On the other hand, a p-type electrode has optical opening portions through which a part of the light of the light-emitting element and a part of the light, a wavelength of which is by a fluorescent paste are emitted to the outside.

A p-type electrode has a light emitting area having the optical opening portions and a bonding area having no opening portion. The optical opening portions are formed to provide the light emitting area.

The optical opening portions may be formed on the bonding area. However, the optical opening portion is not preferably formed on the bonding area, because a mechanical strength is required to realize a wire bonding.

It is preferred to enlarge an area of the optical opening portion from the viewpoint of improvement of a luminance of the light-emitting element, because a light is emitted through the optical opening portion. On the other hand, it is not desirable that the area of the optical opening portion is too large. When the area of the optical opening portion is too large, a remaining area of p-type electrode will be small. Thereby, a light going from the light-emitting element to the side of the p-type electrode can not be fully reflected by the p-type electrode, and a current can not be equally applied to the p-type layer. Therefore, according to inventor's examination, the ratio of the area of the optical opening portions to the remaining area of the p-type electrode is preferably 10:1 to 1:20 in the territory except for the bonding area. More preferably, it is 5:1 to 1:10. Further more preferably, 1:1 to 1:5.

The optical opening portions are preferred to be distributed uniformly on the light emitting area in order to uniform a light emitting on the light emitting side of the light-emitting element.

The optical opening portions may be filled with a light-transmitting material such as a protection film, so far as a light can be passed through there.

The shape of the optical opening portions is not particularly limited. In addition to a rectangle form, any form such as a triangle, a circle, a slit-shaped, etc. may be adopted as viewed horizontally.

A bonding area has at least an area to be required by a wire bonding. According to the inventor's examination, it is sufficient if there is an area of about 80 $\mu$m times 80 $\mu$m.

A bonding wire is directly bonded on the bonding area. Therefore, the bonding area requires the mechanical strength needed for the wire bonding. According to the inventor's examination, when the film thickness of the p-type electrode formed of gold or a gold alloy, etc. is more than 0.3 $\mu$m to be used for general purposes, strength and stability are enough for a wire bonding electrode. More preferably, it is more than 0.5 $\mu$m. Then, the upper limit of the film thickness is not particularly limited. However, the upper limit of the film thickness is preferably 0.5 $\mu$m, because the material of the p-type electrode is expensive.

The light emitting area and the bonding area are preferably provided at the same time from the viewpoint of reducing the number of manufacturing processes, considering the p-type electrode is formed by vapor deposition or other well-known methods. Accordingly, the film thickness of the p-type electrode becomes uniform. A thickness of the p-type electrode is determined to realize a total reflection of a light in an area having no opening portion and a stable wire bonding operation in the bonding area. That is, the p-type electrode preferably have a uniform thickness ranging from 0.3 to 5 $\mu$m, and more preferably 0.5 to 3 $\mu$m.

Materials for the p-side electrode usable herein include metals, such as rhodium (Rh), gold (Au), platinum (Pt), silver (Ag), copper (Cu), aluminum (Al), nickel (Ni), cobalt (Co), magnesium, palladium (Pd), ruthenium (Ru), manganese (Mn), bismuth (Bi), tin (Sn), and rhenium (Re), and alloys of any two or more of them. Among these metals and alloys, rhodium, platinum, and ruthenium are suitable as p-side electrode material, because these materials can efficiently reflect a emission wavelength of the group III nitride compound semiconductor light-emitting element and are low in resistance of contact with the p-type group III nitride compound semiconductor layer. The p-side electrode may have a two-layer or multilayer structure in which layers of different compositions are stacked on each other.

The p-type electrode is formed by vapor deposition, sputtering, or other well-known methods.

(Fluorescent Paste)

A fluorescent paste comprises a light-transmitting base material in which a phosphor is dispersed. The base material is an adhesive for fixing the light-emitting element to a lead frame or the like, for example, a bottom part of a cup-shaped portion on the lead frame. The base material usable herein includes a hot-melt adhesive and other resinous adhesive, for example, an epoxy resin, a silicone resin, a polyester resin, and so on.

The phosphor is arbitrary selected, so that the wavelength of a light emitted from the light emitting layer of the light-emitting element can be converted, and that a light of a desired color can be emitted through the opening portions of p-type electrode by combining the wavelength-converted light and the wavelength-non-converted light emitted from the light emitting layer.

The phosphor usable herein includes an inorganic substance and an organic substance.

The inorganic phosphor usable herein includes as follows. For example, $6MgO \cdot As_2O_5:Mn^{4+}$, $Y(PV)O_4:Eu$, $CaLa_{0.1}Eu_{0.9}Ga_3O_7$, $BaY_{0.9}Sm_{0.1}Ga_3O_7$, $Ca(Y_{0.5}EU_{0.5})(Ga_{0.5}In_{0.5})_3O_7$, $Y_3O_3:Eu$, $YVO_4:Eu$, $Y_2O_2:Eu$, $3.5MgO \cdot 0.5MgF_2GeO_2:Mn^{4+}$, and $(Y,Cd)BO_2:Eu$, which have a reddish luminescence color, $(Ba,Ca,Mg)_5(PO_4)_3Cl:Eu2+$, $(Ba,Mg)_2Al_{16}O_{27}:Eu^{2+}$, $Ba_3MgSi_2O_8:Eu^{2+}$, $BaMg_2Al_{16}O_{27}:Eu^{2+}$, $(Sr,Ca)_{10}(PO_4)_6C_{12}:Eu^{2+}$, $(Sr,Ca)_{10}(PO_4)_6C_{12} \cdot nB_2O_3:Eu_{2+}$, $Sr_{10}(PO_4)_6Cl_2:Eu^{2+}$, $(Sr,Ba,Ca)_5(PO_4)_3Cl:Eu^{2+}$, $Sr_2P_2O_7:Eu$, $Sr_5(PO_4)_3Cl:Eu$, $(Sr,Ca,Ba)_3(PO_4)_6Cl:Eu$, $SrO \cdot P_2O_5 \cdot B_2O_5:Eu$, $(BaCa)_5(PO_4)_3Cl:Eu$, $SrLa_{0.95}Tm_{0.05}Ga_3O_7$, $ZnS:Ag$, $GaWO_4$, $Y_2SiO_6:Ce$, $ZnS:Ag \cdot Ga \cdot Cl$, $Ca_2B_4OCl:Eu^{2+}$, $BaMgAl_4O_3:Eu^{2+}$, and a phosphor represented by general formula $(M1,Eu)_{10}(PO_4)_6Cl_2$ (wherein M1 is at least one element selected from a group of Mg, Ca, Sr, and Ba), which have a bluish luminescence color, $Y_3Al_5O_{12}:Ce^{3+}$(YAG), $Y_2SiO_5:Ce3+.Tb^{3+}$, $Sr_2Si_3O_8.2SrCl_2:Eu$, $BaMg_2Al_{16}O_{27}$: $Eu^{2+}$. $Mn^{2+}$, $ZnSiO_4:Mn$, $Zn_2SiO_4:Mn$, $LaPO_4:Tb$, $SrAl_2O_4:Eu$, $SrLa_{0.2}Tb_{0.8}Ga_3O_7$, $CaY_{0.9}Pr_{0.1}Ga_3O_7$, $ZnGd_{0.8}HO_{0.2}Ga_3O_7$, $SrLa_{0.6}Tb_{0.4}Al_3O_7$, ZnS:Cu.Al, (Zn,Cd)S:Cu.Al, ZnS:Cu.Au.Al, $Zn_2SiO_4:Mn$, $ZnSiO_4:Mn$, ZnS:Ag.Cu, (Zn, Cd)S:Cu, ZnS:Cu, GdOS:Tb, LaOS:Tb, $YSiO_4:Ce.Tb$, $ZnGeO_4:Mn$, GeMgAlO:Tb, SrGaS:Eu2+, ZnS:Cu.Co, $MgO.nB_2O_3:Ge.Tb$, LaOBr:Tb.Tm, and $La_2O_2S:Tb$, which have a greenish luminescence color, $YVO_4:Dy$, which have a whitish luminescence color, and $CaLu_{0.5}Dy_{0.5}Ga_3O_7$, which have a yellowish luminescence color, may be adopted.

The organic phosphor usable herein includes as follows. For example, 1,4-bis(2-methyl styryl)benzene (Bis-MSB), a pigment of the stilbene family including trans-4,4'-diphenyl stilbene (DPS), a pigment of the coumarin family including 7-hydroxy-4-methyl coumarin (Coumarin 4), BOQP, PBBO, BOT, and POPOP can be used. These pigments have a bluish luminescence color. DPOT, brilliantsulfoflavine FF, basic yellow HG, and SINLOIHI COLOR FZ-5005 (manufactured by SINLOIHI COMPANY) can be also used. These pigments have a yellowish or greenish luminescence color. Additionally, eosine, rhodamine 6G, rhodamine B, and NKP-8303 (manufactured by NIHON KEIKOU KAGAKU COMPANY) can be also used. These pigments have a yellowish or reddish luminescence color. More additionally, poly methyl methacrylate (PMMA) obtained by dissolution and (condensation) polymerization of TB(EDTA)SSA, EuTTA, etc. into, for example, methyl methacrylate may be also used.

In addition, a phosphor obtained by combining different kinds of two or more phosphors can be also used.

The concentration distribution of the phosphor in the fluorescent paste may be changed in accordance with a purpose of use, a condition of use, and so on. In other words, the amount of the phosphor may be changed continuously or in a step manner dependently on a distance from the bottom of the light-emitting element. For example, the concentration of the phosphor is increased in the part which is close to the light-emitting element. Thereby, the phosphor can be efficiently irradiated in the paste by the light emitted from the light-emitting element. On the other hand, the phosphor is affected by a heat generated in the light-emitting element, and therefore it causes a deterioration of the phosphor. On the other hand, the deterioration of the phosphor caused by the heat of the light-emitting element is suppressed by making the concentration of the phosphor smaller as a distance from the bottom of the light-emitting element is small. Accordingly, a mode of changing the dispersion concentration of the phosphor is chosen properly in consideration of a material of the phosphor, an environment of use of the light-emitting element, and so on.

A surface of the substrate of the light-emitting element is coated with a small quantity of the base material dispersed with the phosphor, and then the base material not including the phosphor is stacked thereon. Thereby, the concentration distribution of the phosphor in the fluorescent paste may be changed. On the other hand, a plurality of base materials each having a different amount of a phosphor are prepared to be stacked on each other in a predetermined order, so that the concentration of the phosphor is changed gradually dependently on a distance from the bottom of the light-emitting element. For the same purpose, a plurality of base materials containing different phosphors may be prepared to be stacked on each other in a predetermined order.

Next, preferred embodiments of a light emitting device of the present invention will be explained.

(First Preferred Embodiment)

FIG. 1 is an explanatory view showing a shell-shaped LED 1 which is a light emitting device in a preferred embodiment of the invention. LED 1 emits a whitish light, and is available for, for example, a planer light source and a linear light source in combination with a light guiding body, and further available for various display apparatuses as well.

Figure 2:
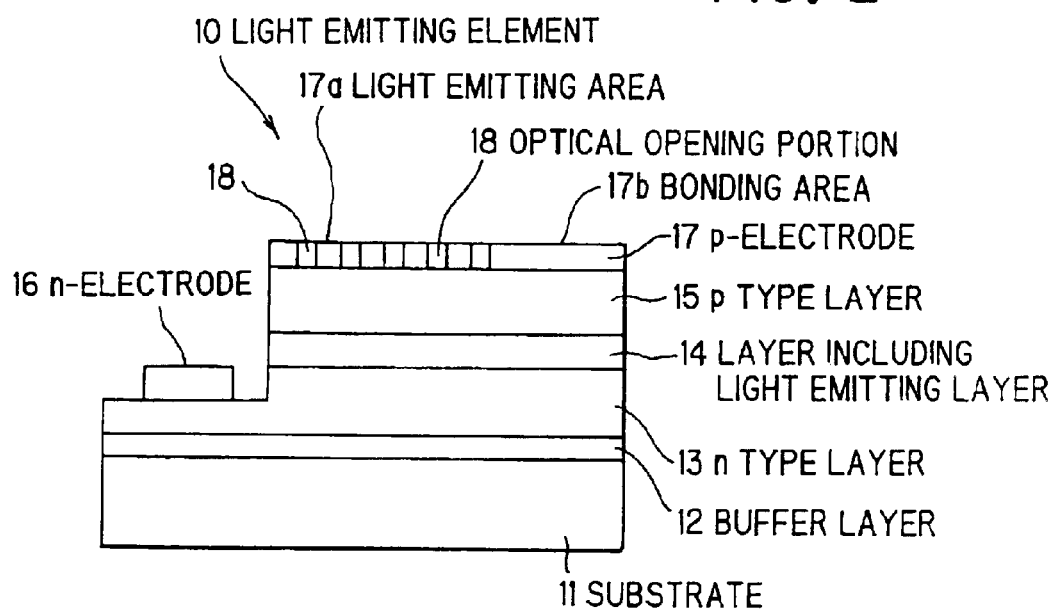
FIG. 2 is a schematic cross-sectional view showing a frame format of the construction of a light-emitting element of the invention.

FIG. 2 is a cross-sectional view showing a light-emitting element 10 which is used in LED 1. The light-emitting element 10 has a emission wavelength of about 460 nm, and details of individual layers constituting the light-emitting element 10 are as follows.

| Layer | Composition |
| --- | --- |
| p-type layer 15 | p-AlGaN:Mg (doped with Mg) |
| The layer 14 including light emitting layer | Including InGaN layer |
| n-type layer 13 | n-GaN:Si (doped with Si) |
| Buffer layer 12 | AlN |
| Substrate 11 | Sapphire |

An n-type layer 13 of GaN doped with silicon as an n-type impurity is formed on the substrate 11 through a buffer layer 12. Here, sapphire was used as the substrate 11. The substrate 11, however, is not limited to sapphire. For example, sapphire, spinel, silicon, silicon carbide, zinc oxide, gallium phosphide, gallium arsenide, magnesium oxide, manganese oxide, and a single crystal of group III nitride compound semiconductor may be used. The buffer layer may be formed by MOCVD using AlN. The material for the buffer layer, however, is not limited to AlN, and other materials for the buffer layer usable herein include, for example, GaN, InN, AlGaN, InGaN, and AlInGaN. Methods for the formation of the buffer layer usable herein include molecular beam epitaxy (MBE), halide vapor phase epitaxy (HVPE), sputtering, ion plating, and electron shower. When the group III nitride compound semiconductor is used as the substrate, the provision of the buffer layer may be omitted.

The substrate and the buffer layer may be, if necessary, removed after the formation of the light-emitting element.

In this preferred embodiment, the n-type layer 13 was formed of GaN. Alternatively, the n-type layer 13 may be formed of AlGaN, InGaN, or AlInGaN.

Further, in this preferred embodiment, silicon was doped as an n-type impurity into the n-type layer 13. Germanium (Ge), selenium (Se), tellurium (Te), carbon (C) and the like may also be used as the n-type impurity.

The n-type layer 13 may have a two-layer structure composed of an n layer having a low electron concentration provided on the side of the layer 14 including the light emitting layer, and an n layer having a high electron concentration provided on the side of the buffer layer 12.

The layer 14 including the light emitting layer may include a quantum well structure (a single quantum well structure or a multiple quantum well structure). The light-emitting element may have a single hetero structure, a double hetero structure, or a homozygous structure.

The layer 14 including the light emitting layer may include a wide-band-gap group III nitride compound semiconductor layer doped with an acceptor such as magnesium and provided on the p-type layer 15 side. The purpose of providing this wide-band-gap group III nitride compound semiconductor layer doped with an acceptor is to effectively prevent the electrons injected into the layer 14 including the light emitting layer from being diffused into the p-type layer 15.

The p-type layer 15 formed of AlGaN doped with magnesium as a p-type impurity is formed on the layer 14 including the light emitting layer. This p-type layer 15 may also be formed of GaN, InGaN, or InAlGaN. Other p-type impurities usable herein include zinc (Zn), beryllium (Be), calcium (Ca), strontium (Sr), and barium (Ba).

The p-type layer 15 may have a two-layer structure composed of a p⁻ layer having a low hole concentration, provided on the side of the layer 14 including the light emitting layer, and a p⁺ layer having a high hole concentration provided on the electrode side.

In the light emitting diode having the above construction, each group III nitride compound semiconductor layer may be formed by MOCVD under conventional conditions, or alternatively may be formed, for example, by molecular beam epitaxy (MBE), halide vapor phase epitaxy (HVPE), sputtering, ion plating, or electron shower.

In this example, an n-electrode 16 has a two-layer structure of aluminum and vanadium. After the p-type layer 15 is formed, the p-type layer 15, the layer 14 including the light emitting layer, and a part of the n-type layer 13 are removed by etching, followed by the formation of the n-electrode 16 on the n-type layer 13 by vapor deposition.

A p-electrode 17 has a stacked structure of rhodium and gold. The p-electrode 17 is formed on the p-type layer 15 by vapor deposition. A film thickness of the p-electrode 17 is about 1.5 μm.

Figure 3A:
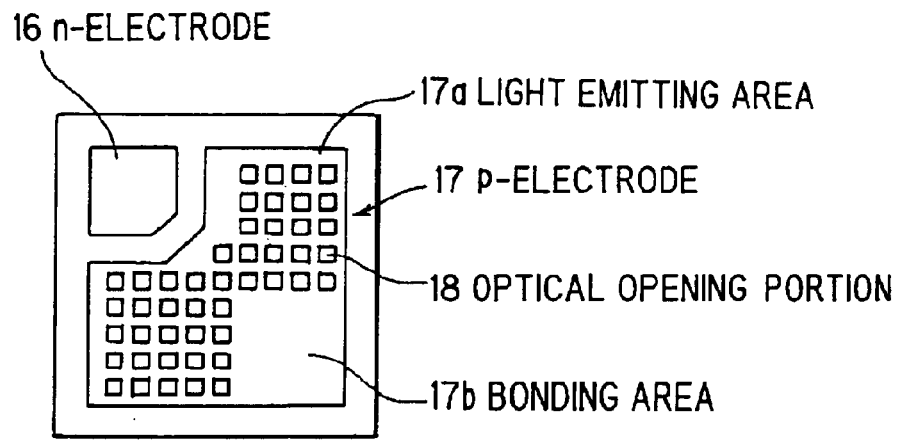
FIGS. 3A through 3C are plan views showing p-type electrodes in light-emitting elements of the invention.

As shown in FIG. 3A, the p-electrode 17 has a light emitting area 17a and a bonding area 17b. In the p-electrode 17 shown in FIG. 3A, the light emitting area 17a has oblong opening portions 18. The opening portions 18 are formed by lift-off method.

Each of the opening portions 18 is square in shape having a side of 15 μm to provide a lattice-shaped light emitting area 17a. For instance, an interval of the opening portion 18 is 15 μm in the light emitting area. The opening portion 18 is positioned uniformly on the light emitting area.

Figure 3B:
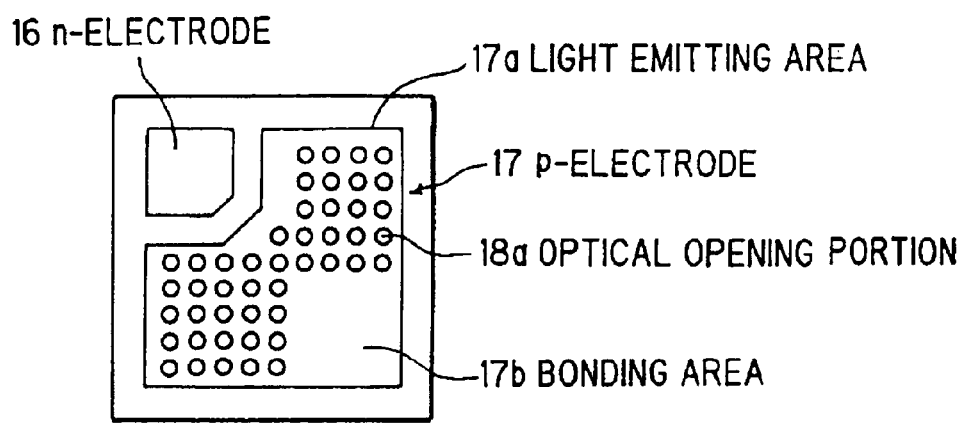
Figure 3C:
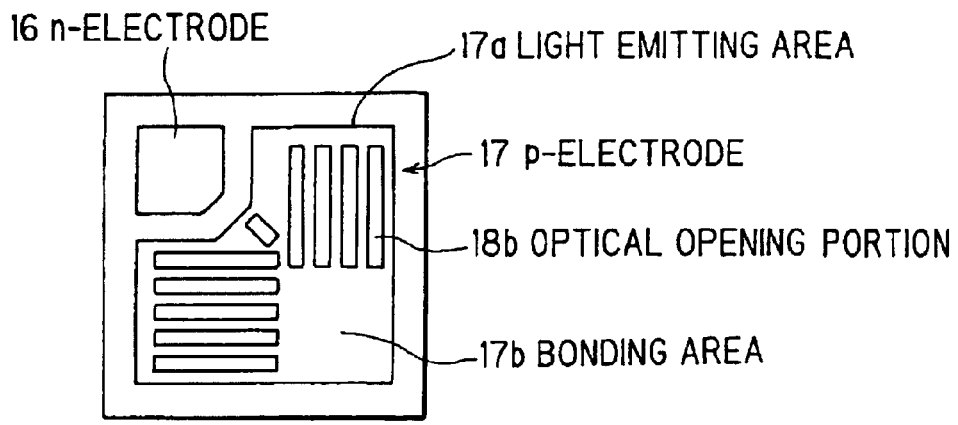

The shape of the opening portions 18 is not limited to the square. An example of circular opening portions 18 is shown in the FIG. 3B. An example of slit-shaped opening portions 18 is shown in the FIG. 3C. Additionally, any shape such as a triangle, a polygon including a pentagon and a hexagon, a star-type, a moon-type, and so on may be adopted. Each of the opening portions 18 maybe different in shape and/or sizes in the light emitting area 17a.

Although there is a case where the p-type electrode 17 is covered with a light-transmitting protection film such as silicone oxide, etc., a transmission of light through the opening portions 18 and an emission of light therefrom to outside are not hindered, even if the opening portions 18 are buried with the protection film. That is, even if the opening portions 18 are not open physically, but it may be open optically.

As shown in FIG. 1, the light-emitting element 10 is mounted in a cup-shaped portion 25 provided on a lead frame 20 by using a fluorescent paste 26. A surface of the cup-shaped portion 25 as a mounting seat of a light-emitting element has a surface of a mirror from the viewpoint of increasing light reflection efficiency. The fluorescent paste 26 comprises a light-transmitting epoxy resin dispersed with ZnS:Cu,Au,Al (emission wavelength peak: 535 nm) as a phosphor.

This phosphor absorbs the light emitted from the light emitting layer (the light inherent to the light-emitting element: a wavelength is about 460 nm), and is excited to emit a yellowish fluorescent light. This yellowish light is combined with the inherent light of the light-emitting element to form a whitish light.

In the light-emitting element 10, the bonding area 17b of the p-electrode 17 is wire-bonded to a lead frame 21 by a wire 41, while the n-electrode 16 is wire-bonded to the lead frame 20 by a wire 40.

The light-emitting element, a part of the lead frames 20 and 21, and the bonding wires 40 and 41 are sealed by a sealing resin 50 of an epoxy resin. Material for the sealing resin 50 is not especially limited as long as these are light-transmitting. Materials for the sealing resin 50 usable preferably herein include, in addition to the epoxy resin, a silicone resin, a urea resin, and a glass. A phosphor and/or an optical diffusion material may be dispersed in the sealing resin 50 uniformly or un-uniformly.

Although the sealing resin 50 is provided, for example, from the viewpoint of protecting the light-emitting element, a lens effect may be imparted to the sealing resin 50 by shaping the sealing resin 50 depending upon purposes. For example, the sealing resin 50 may be molded into a shell shape shown in FIG. 1, or into a concave lens shape, a convex lens shape or the like. Further, the shape of the sealing resin 50 maybe circular, elliptical, or rectangular as viewed from a light output direction (upper side in FIG. 1).

In LED 1 having the above construction, a part of a bluish light emitted from the layer 14 including the light emitting layer of the light-emitting element 10 to the upper side (a side of p-type layer) is reflected totally by the p-type electrode, and is entered to the fluorescent paste 26. A light emitted from the layer 14 including the light emitting layer to the lower side (a side of n-type layer) is also entered to the fluorescent paste 26. A part of the light entered to the fluorescent paste 26 is converted in wavelength to provide a yellowish light, and then the yellowish light is directed to a side of the p-type electrode 17. This fluorescent light is combined with the inherent light to the light-emitting element to provide a whitish light, and then the whitish light is released from the opening portions 18 of the p-type electrode 17. The inherent light to the light-emitting element and a part of the fluorescent light not released outside through the opening portions 18 are reflected by the p-type electrode 17 and the cup-shaped portion 25, and finally released from the opening portions 18 and the both sides of the light-emitting element 10.

The lights emitted from the light-emitting element 10 are gathered in a direction of an optical axis by the lens action of the sealing resin 50, and thereby, finally these lights are combined with each other.

(Second Preferred Embodiment)

Figure 4:
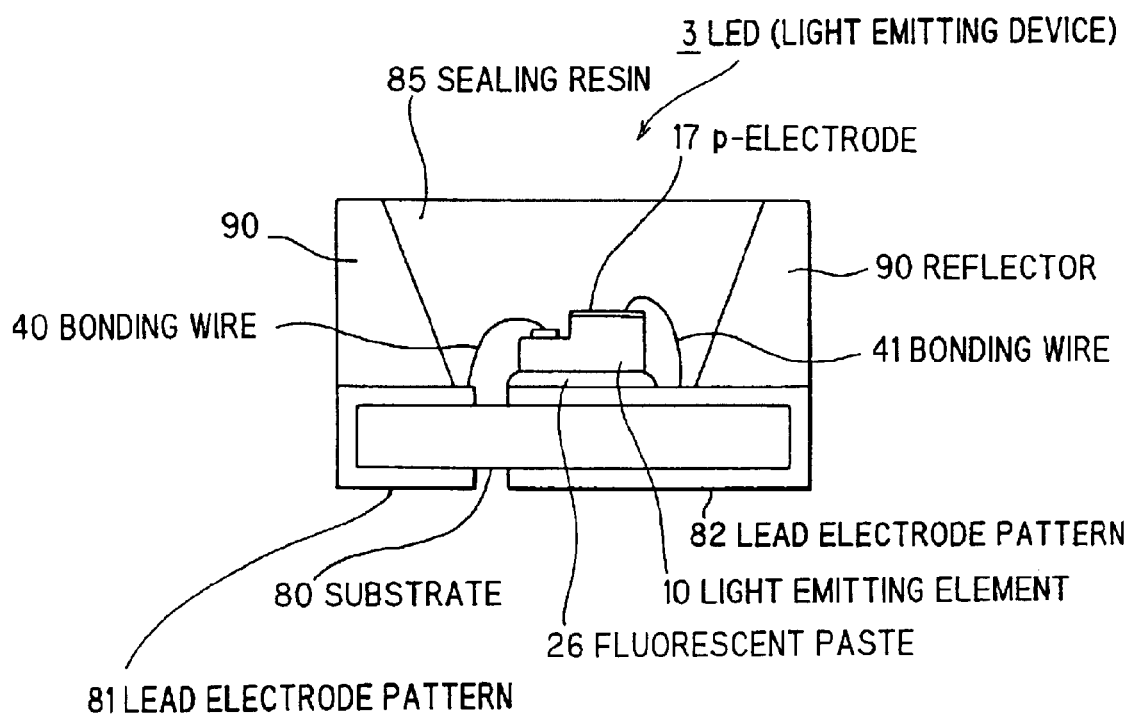
FIG. 4 is a schematic cross-sectional view showing the construction of an SMD-type LED which is a light emitting device in an embodiment of the invention.

FIG. 4 is a schematic cross-sectional view of an SMD-type LED 3 in a second preferred embodiment of the invention. In FIG. 1 showing LED 1 and FIG. 4 showing LED 3, like parts are identified with the same reference numerals, and the overlapped explanation thereof will be omitted. LED 3 emits a whitish light in the same manner as well as LED 1, and is available for, for example, a planer light source and a linear light source in combination with a light guiding body, and further available for various display apparatuses as well.

A light-emitting element 10 is fixed to a substrate 80 by using a fluorescent paste 26. Wires 40 and 41 connect the electrodes of the light-emitting element 10 respectively to electrodes 81 and 82 provided on the substrate 80. Numeral 85 designates a sealing resin. Numeral 90 designates a reflector provided on the periphery of the light-emitting element 10. The inner surface of the reflector 90 is a mirror surface.

In LED 3 having the above construction, a bluish light emitted from the light-emitting element 10 is combined with a yellowish light converted in wavelength by a phosphor to emit a whitish light in the same operation as in LED 1.

This invention is not limited to the above embodiments and explanation thereof, and variations and modifications can be effected within the scope which does not depart from the description in the claims and can be easily conceived by a person having ordinary skill in the art.

What is claimed is:

1. A light-emitting element, comprising:
   a light emitting layer for emitting a light of a predetermined wavelength; and
   p- and n-type electrodes for applying a predetermined voltage across the light emitting layer;
   wherein the p-type electrode is provided on a light-radiating side of the light emitting layer, and includes;
   a light emitting area for transmitting a light therethrough, and a wire-bonding area to an outside surface of which a bonding wire is bonded and for reflecting a light on an inside surface thereof.

2. The light-emitting element according to claim 1, wherein the light emitting area comprises a predetermined number of opening portions arranged in a predetermined pattern.

3. The light-emitting element according to claim 2, wherein each of the predetermined number of opening portions comprises at least one of a rectangle-shape, a circle-shape, and a slit-shape.

4. The light-emitting element according to claim 1, wherein a thickness of the light emitting area is substantially equal to a thickness of the wire-bonding area.

5. A light emitting device, comprising:
   a light-emitting element comprising a light emitting layer for emitting a light of a predetermined wavelength, and p-and n-type electrodes for applying a predetermined voltage across the light emitting layer;
   a lead structure including p-and n-leads for mounting the light-emitting element thereon; and
   a light-transmitting paste comprising a phosphor for fixing the light-emitting element to the lead structure;
   wherein the p-type electrode is provided on a light-radiating side of the light emitting layer, and includes;
   a light emitting area for transmitting a light therethrough, and
   a wire-bonding area to an outside surface of which a bonding wire is bonded and for reflecting a light on an inside surface thereof.

6. The ligiht emitting device according to claim 5, wherein the wire-bonding area reflects a substantially whole portion of the light on the inside surface thereof.

7. The light emitting device according to claim 5, wherein the light emitting area comprises a predetermined number of opening portions arranged in a predetermined pattern.

8. The light emitting device according to claim 5, wherein each of the predetermined number of opening portions comprises at least one of a rectangle-shape, a circle-shape, and a slit-shape.

9. The light emitting device according to claim 5, wherein a thickness of the light emitting area is substantially equal to a thickness of wire-bonding area.

10. The light emitting device according to claim 9, wherein the light emitting area and the wire-bonding area each comprise a uniform thickness of equal to or greater than 0.3 $\mu$m.

11. The light emitting device according to claim 5, wherein the light emitting area transmits a whitish light from inside to outside therethrough in accordance with the light of the predetermined wavelength and a light of a converted wavelength emitted from the phosphor which is excited by the light of the predetermined wavelength.

12. The light emitting device according to claim 5, wherein the p- and n-leads of the lead structure are p- and n- lead frames, one of the p- and n-lead frames including a cup-shaped portion in which the light-emitting element is mounted via the light-transmitting paste; and
    the p- and n-type electrodes are connected to the p- and n-lead frames by bonding wires, respectively.

13. The light emitting device according to claim 12, wherein the light-emitting element, the bonding wires, and portions of the p- and n-lead frames are sealed by a sealing resin.

14. The light emitting device according to claim 12, wherein the sealing resin comprises a lens shape for focusing a light transmitted through the light emitting area.

15. The light emitting device according to claim 5, wherein the p- and n-leads of the lead structure comprise p- and n- electrode patterns provided on a substrate, one of the p- and n-electrode patterns including an element-mounting portion on which the light-emitting element is mounted via the light-transmitting paste; and
    the p- and n-type electrodes are connected to the p- and n-electrode patterns by bonding wires, respectively.

16. The light emitting device according to claim 15, wherein a reflector including an inner mirror surface of a reverse conical shape for reflecting the light of the predetermined wavelength and a light of a converted wavelength emitted from the phosphor which is excited by the light of the predetermined wavelength.

17. The light emitting device according to claim 16, wherein the light-emitting element, the bonding wires, and portions of the p- and n-electrode patterns are sealed in the reflector by a sealing resin.

* * * * *